(12) United States Patent
Narhi et al.

(10) Patent No.: US 7,200,009 B2
(45) Date of Patent: Apr. 3, 2007

(54) INTEGRATED ELECTROMECHANICAL ARRANGEMENT AND METHOD OF PRODUCTION

(75) Inventors: Katri Narhi, Vantaa (FI); Roope Takala, Espoo (FI); Jari Nousiainen, Espoo (FI); Pentti Ahlgren, Helsinki (FI); Pia Tanskanen, Helsinki (FI)

(73) Assignee: Nokia Corporation, Espoo (FI)

( * ) Notice: Subject to any disclaimer, the term of this patent is extended or adjusted under 35 U.S.C. 154(b) by 328 days.

(21) Appl. No.: 10/612,397

(22) Filed: Jul. 1, 2003

(65) Prior Publication Data

US 2005/0002168 A1 Jan. 6, 2005

(51) Int. Cl.
*H05K 5/00* (2006.01)

(52) U.S. Cl. .................. 361/759; 200/512; 361/749

(58) Field of Classification Search .............. 361/800, 361/749, 760, 759; 174/260
See application file for complete search history.

(56) References Cited

U.S. PATENT DOCUMENTS 5,576,981 A * 11/1996 Parker et al. ............... 708/140
6,172,620 B1 * 1/2001 Brick et al. .................. 341/22
6,504,928 B1 * 1/2003 Toyooka ................. 379/433.01
6,633,241 B2 * 10/2003 Kaikuranta et al. .......... 341/33
2003/0075825 A1 * 4/2003 Yoneda et al. ......... 264/272.11

\* cited by examiner

*Primary Examiner*—Dean A. Reichard
*Assistant Examiner*—Ivan Carpio
(74) *Attorney, Agent, or Firm*—Alfred A. Fressola; Ware, Fressola, Van Der Sluys & Adolphson LLP

(57) ABSTRACT

It is an object of the invention to provide a electromechanical structure comprising an input device and a printed wired board (3, 4), which structure is advantageous in terms of manufacturing and offers freedom to the layout design of the printed wired board, the user interface as well as the appearance of the device itself. It is also an object of the invention to provide a electromechanical structure that is compact and facilitates the customizability and upgradability with a new electronic functionality without any need for modifications to the main electronics of the device. This is achieved by integrating the electromechanical assembly with the mechanical cover part of the electronic device by using an injection moulding process to compose an integrated combination (113) which is detachable from the electronic device. More precisely the objects of the invention are achieved by combining the injection mould technologies with the printing of electronic wired boards.

60 Claims, 7 Drawing Sheets

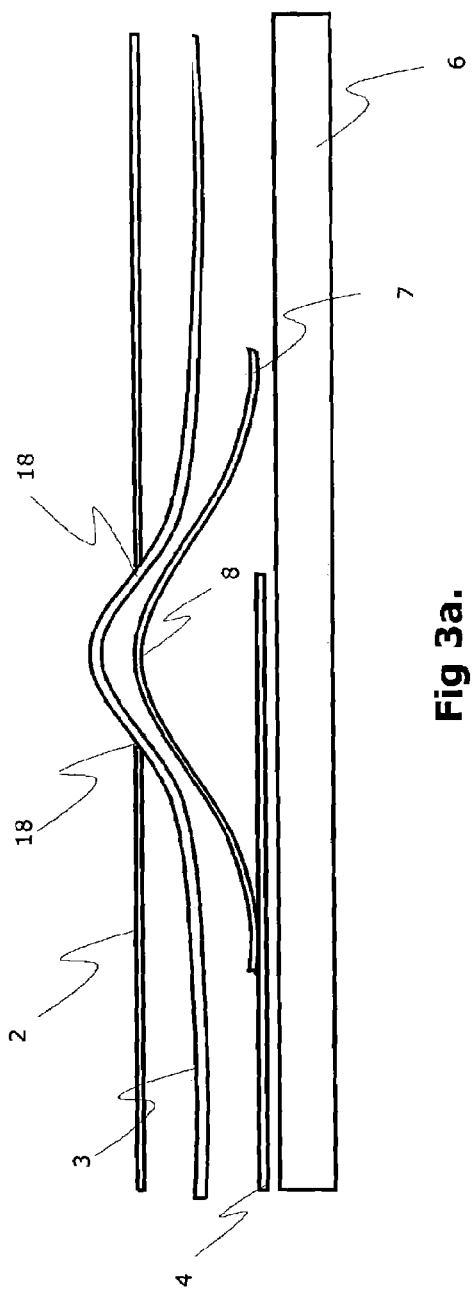
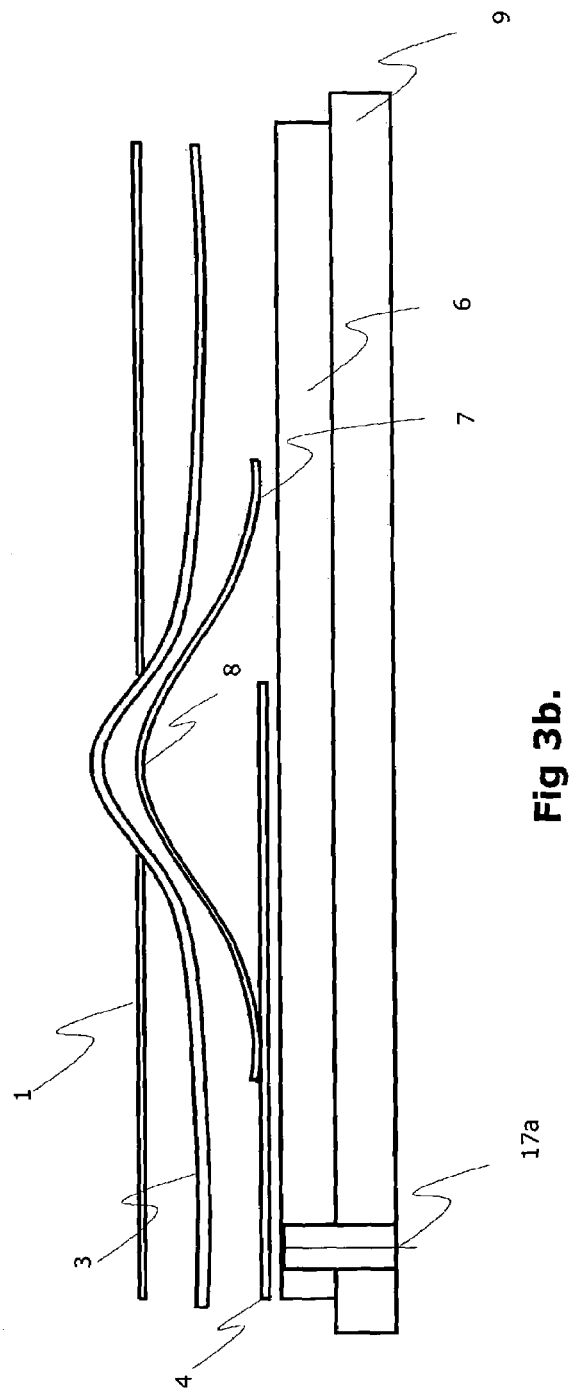
Fig 3a.
Fig 3b.

INTEGRATED ELECTROMECHANICAL ARRANGEMENT AND METHOD OF PRODUCTION

TECHNICAL FIELD OF THE INVENTION

The present invention relates generally to the electromechanical structures of portable electronic devices, electronic circuits, printed wired boards, electronic components and encapsulation. Especially the invention concerns the integration of electromechanical keypad arrangements and mechanical parts of an electronic device.

BACKGROUND OF THE INVENTION

An input device is an important part of many portable electronic devices and it is used to control operation and input information to the electronic device. In portable electronic devices such as computers, communication devices, measuring devices and similar devices the most common input devices used are keypads, keyboards and touch panels consisting of individually pressable or touchable numeric or alphanumeric, function and control keys. To activate these kind of input devices a user must press or touch a certain key or a certain touch point to accomplish a desired operation.

A known structural arrangement is to build up a keypad system on a printed wired board (PWB) with a number of contact pads on its upper surface. In this description the printed wired board (PWB) is used as an general designation for both the printed circuit board (PCB) and the PWB. The actual key switches are located on the PWB at the points where conductive input rows and conductive output columns form a junction, i.e. a key switch, comprising a conductive dome. An insulating film covers the PWB except of those contact pads onto which components are to be placed. The keypad part comprises a dome sheet or alternatively a selection of individual key domes made of some resilient material that is electrically conductive at least at the concave surface of each dome. Additionally the keypad part comprises a rubbery keymat where the bulging protrusions coincide with the conductive domes of the dome sheet and constitute the visible parts of the keys. Pressing the key will cause the conductive dome to produce an electrical contact at the key switch.

In portable electronic devices such as mobile phones, communicators and laptops the keypad arrangement is built on the "engine PWB". The engine PWB is a common designator of such printed wired boards that comprise a remarkable number of electronic components that implement the main functionalities of the telecommunication device. The electronic part of the portable device, the engine PWB being part of this electronic module, is usually encapsulated so that it is shielded against electromagnetic interference and other disturbances. Thus the electronic part constitutes its own entity which is then enclosed in the outer casing forming the cover part of the portable device. The rubbery keymat with bulging protrusions constitutes one side of the electronic part of the portable device and this side will abut on the cover part with openings fixed for bulging protrusions. The electronic part and cover part is then anchored to each other with fasteners.

Today manufacturing processes for keypad arrangements and cover parts of portable devices are totally different and are commonly performed even in separate manufacturing facilities by different providers or sub-contractors. The keypad arrangement including circuitry, electronic components and sheet material components is manufactured by conventional PWB manufacturing processes including screen printing, component assembling and reflow soldering. The cover part is generally manufactured by engineering plastic moulding processes.

A printed wired board (PWB) or a printed wiring board is a rigid support with connections in the form of flat metal strips. Typically the connections are "printed" as a pattern of lines of etch-resist ink over a uniform metal coating on the board. Etching removes the unmasked regions, leaving the interconnect lines. The etch-resist is then also washed off, leaving the wires exposed and available for connection. At the ends of the lines, holes may be drilled to allow the leads of surface components or sockets to be passed through. Discrete components like resistors and power transistors are inserted directly. Microchips and the like are soldered on directly or sockets are soldered onto the board where these active components are then inserted.

Exchangeable covers have gained popularity especially among young consumers who want visually-differentiated cover parts to their portable electronic devices. The cover part can be decorated using so called in mould decoration (IMD) processes which are gaining ground nowadays. This technique consists of the decoration of an injection moulded part during the moulding process. A special carrier film or foil, which is also called in mould decoration (IMD) foil or customized injection mould (CIM) foil, is used to forge the decoration to the cover part. In the IMD process a flat piece of film or foil is first decorated with desired texts, patterns, images, pictures or alike layouts and then the film is formed to fit the profile of the injection mould and cut to shape. After that the film is inserted as an insert into a mould cavity, where finally moulding resin is injected onto the back of the film. The resin fuses onto the back of the film, and the materials are bonded together. The cover part is now complete and no postprocessing is required. As high temperature moulding resins typically polycarbonate, ABS and blends are used. ABS is an acronym for acrylonitrile-butadiene-styrene copolymers, which are elastomer-modified styrene plastics (thermoplastic). For example, key caps and buttons made of pre-printed foil can be implemented in the cover parts formed from in-coloured co-extruded film using IMD process.

Today, high pressure formed decorative printed foil keypads with back injection moulded taps using IMD technology are widely used in electronics and this same technology is also used in cover part manufacturing. These keypads and covers need a separate printed wired board for user interface connections, tactile feed back and other electronic functionality, which separate PWB is physically locating in connection with the electronic part of the portable device.

The need for miniaturization of portable electronic devices sets limits to the size of the electronic part comprising the engine PWB which is a reason why the engine PWB is used as an electronic platform for keypad arrangements. This means that the keypad arrangement and the engine PWB layout is fixed to each other and it will be difficult to change the keypad layout without changing the engine PWB. This kind of keypad arrangement limits a lot the freedom to design differentiated keypad layouts to exchangeable cover parts of the portable electronic devices.

In view of various inherent limitations of integrating keypad arrangements flexibly to the portable electronic devices, it would be desirable to avoid or mitigate these and other problems associated with prior art arrangements. Thus, there is a need for new techniques to provide electronics-mechanics integration for electronic devices.

SUMMARY OF THE INVENTION

It is an object of the invention to provide a electromechanical structure comprising a user interface and a printed wired board, which structure is advantages in terms of manufacturing and offers freedom to the layout design of the printed wired board, the user interface as well as the appearance of the device itself. It is also an object of the invention to provide a electromechanical structure that is compact and facilitates the customizability and upgradability with a new electronic functionality without any need for modifications to the main electronics of the device.

The objects of the invention are achieved by integrating the electromechanical assembly with the mechanical cover part of the electronic device by using an injection moulding process to compose an integrated combination which is detachable from the electronic device. More precisely the objects of the invention are achieved by combining the injection moulding technologies with the printing of electronic wired boards.

In accordance with a first aspect of the invention there is provided an electromechanical assembly for an electronic device, the electromechanical assembly comprising at least a printed wired foil and means for electrically connecting the electromechanical assembly to the electronic device, the electronic device comprising at least one cover part and means for mechanically connecting the cover part to the electronic device, wherein the electromechanical assembly and the cover part are arranged to compose an integrated combination which is detachable from the electronic device.

In a preferred embodiment a keypad assembly is provided for integrating the keypad assembly with the cover part to compose an integrated combination which is detachable from the electronic device.

Preferably, the keypad assembly is integrated into the cover part.

In another preferred embodiment, a touch sensor assembly is provided for integrating the touch sensor assembly with the cover part to compose an integrated combination which is detachable from the electronic device.

Preferably, the touch sensor assembly is integrated into the cover part.

In accordance with a second aspect of the invention there is provided a cover part for an electronic device, the electronic device comprising an electromechanical assembly which comprises at least a printed wired foil and means for electrically connecting the electromechanical assembly to the electronic device, and the electronic device still comprising means for mechanically connecting the cover part, wherein the electromechanical assembly and the cover part are arranged to compose an integrated combination which is detachable from the electronic device.

In a preferred embodiment a cover part is provided for integrating a keypad assembly into the cover part.

In another preferred embodiment a cover part is provided for integrating a touch sensor assembly into the cover part.

Preferably, the cover part is an exchangeable cover part of electronic devices.

In accordance with a third aspect of the invention there is provided a method for manufacturing an electromechanical assembly for an electronic device, the electromechanical assembly comprising at least a printed wired foil, and the electronic device comprising at least one cover part, the method comprising steps:

electrically connecting the printed wired foil to the electromechanical assembly and to the electronic device, mechanically connecting the cover part to the electronic device, and composing the electromechanical assembly and the cover part to be an integrated combination which is detachable from the electronic device.

In a preferred embodiment a method for manufacturing a keypad assembly is provided for integrating the keypad assembly with the cover part to compose an integrated combination which is detachable from the electronic device.

Preferably, the keypad assembly is integrated into the cover part.

In another preferred embodiment a method for manufacturing a touch sensor assembly is provided for integrating the touch sensor assembly with the cover part to compose an integrated combination which is detachable from the electronic device.

Preferably, the touch sensor assembly is integrated into the cover part.

In accordance with a fourth aspect of the invention there is provided a method for manufacturing a cover part for an electronic device, the electronic device comprising at least an electromechanical assembly which comprises at least a printed wired foil, wherein the method comprises steps of:

electrically connecting the printed wired foil to the electronic device, mechanically connecting the cover part to the electronic device, and composing the electromechanical assembly and the cover part to be an integrated combination which is detachable from the electronic device.

In a preferred embodiment a method for manufacturing a cover part is provided for integrating a keypad assembly into the cover part.

In another preferred embodiment a method for manufacturing a cover part is provided for integrating a touch sensor assembly into the cover part.

Preferably, the cover part is an exchangeable cover part of electronic devices.

According to the invention all electronic components including connectors outwards, electronic printed wired boards associated with the user interface and other input/output devices as well as mechanical components are structurally associated with a cover part and not with an "engine PWB" which is a common designator of such printed wired boards that comprise a remarkable number of electronic components that implement the main functionalities of an electronic device.

As a consequence of the invention numerous advantages are achieved. The layout design of the user interface and the printed wired board is freed from the characteristics and design of the main electronic device and the standardized engine PWB layout. In portable electronics there is a drive to standardize the engine PWB, but at the same time there is a drive to expand the types of user interfaces of the portable devices. A great degree of freedom is given to design of cover parts and exchangeable outer covers. The manufacturing technologies and processes according to the invention also allow new electronic functions to be produced in the cover part. The location, number and size of electronic functional elements become completely independent of the engine PWB layout. Minituarisation is made possible because large areas of the engine PWB surface space are left free, or the saved PWB surface is free for other use. Realization of watertight and hermetically sealed touch-controlled electronic devices become easier to produce because the manufacturing technology enables complete sealing of the electromechanical assembly and user interface when enfold into the plastic resin. The manufacturing process according to invention is affordable in price.

BRIEF DESCRIPTION OF THE DRAWINGS

The novel features which are considered as characteristic of the invention are set forth in particular in the appended claims. The invention itself, however, both as to its construction and its method of operation, together with additional objects and advantages thereof, will be best understood from the following description of specific embodiments when read in connection with the accompanying drawings.

FIG. 1b shows more detailed the area A of FIG. 1a.

FIG. 3a shows a cross-section diagram of a keypad structure according one embodiment of the electromechanical assembly.

FIG. 3b shows a cross-section diagram of a keypad structure according another embodiment of the electromechanical assembly.

DETAILED DESCRIPTION OF THE INVENTION

An electromechanical assembly for an electronic device comprises both electrical and mechanical function components which will be part of the electronic device. Typically an electromechanical assembly is an input/output device to relay information from user to the electronic unit of the electronic device, and vice versa. The input/output device is activated by pressing, touching, blowing or acting other physical manner to the user interface of the input/output device. In this description the term assembly is used to describe that the system comprises both electronic and mechanical components, e.g. a keypad assembly comprises electronic components such as conductors, resistors, detectors, leds etc. on a printed wired board and mechanical components such as keydomes on a printed wired board. In portable electronic devices multi-layer foils made of flexible conductive material are commonly used as a platform for an electronic circuitry instead of printed wired boards. Thus, in this description the term printed wired foil is used instead of printed wired board.

In portable electronic devices such as mobile phones there is a drive to standardize the engine PWB, but at the same time there is a drive to expand the types of user interfaces such as keypads of the portable devices. In case of the keypad where the actual key switches, domes and pads are usually on the engine printed wired board (PWB) this causes a problem because the keypad layout cannot be changed without changing the engine PWB layout. To overcome this problem is accomplished by separating the keypad from the engine PWB and placing it into the front or back cover of the mobile phone. By doing so the keypad is not part of the engine hardware of the mobile phone and any layouts of user interfaces can be produced, and a customer can choose the one or the ones he wants to have, just buying an add on cover. It is also possible to integrate special user interfaces into the cover parts of the mobile phone to be used for e.g. gaming, picture editing and chinese handwriting recognition. The manufacturing technologies and processes according to the invention also enable new functions to be produced in the phone cover which means that a customer can select and buy new functionalities for his mobile phone at any time, not just when he initially purchases the mobile phone.

The invention presented covers mainly three different domains, namely firstly an idea of printing conductors and electronics onto an in mould decoration (IMD) foil prior to its forming, secondly a manufacturing process that is utilized, and thirdly technological components, such as conductive ink and interconnects to the printed electronics, that are needed.

Figure 1A:
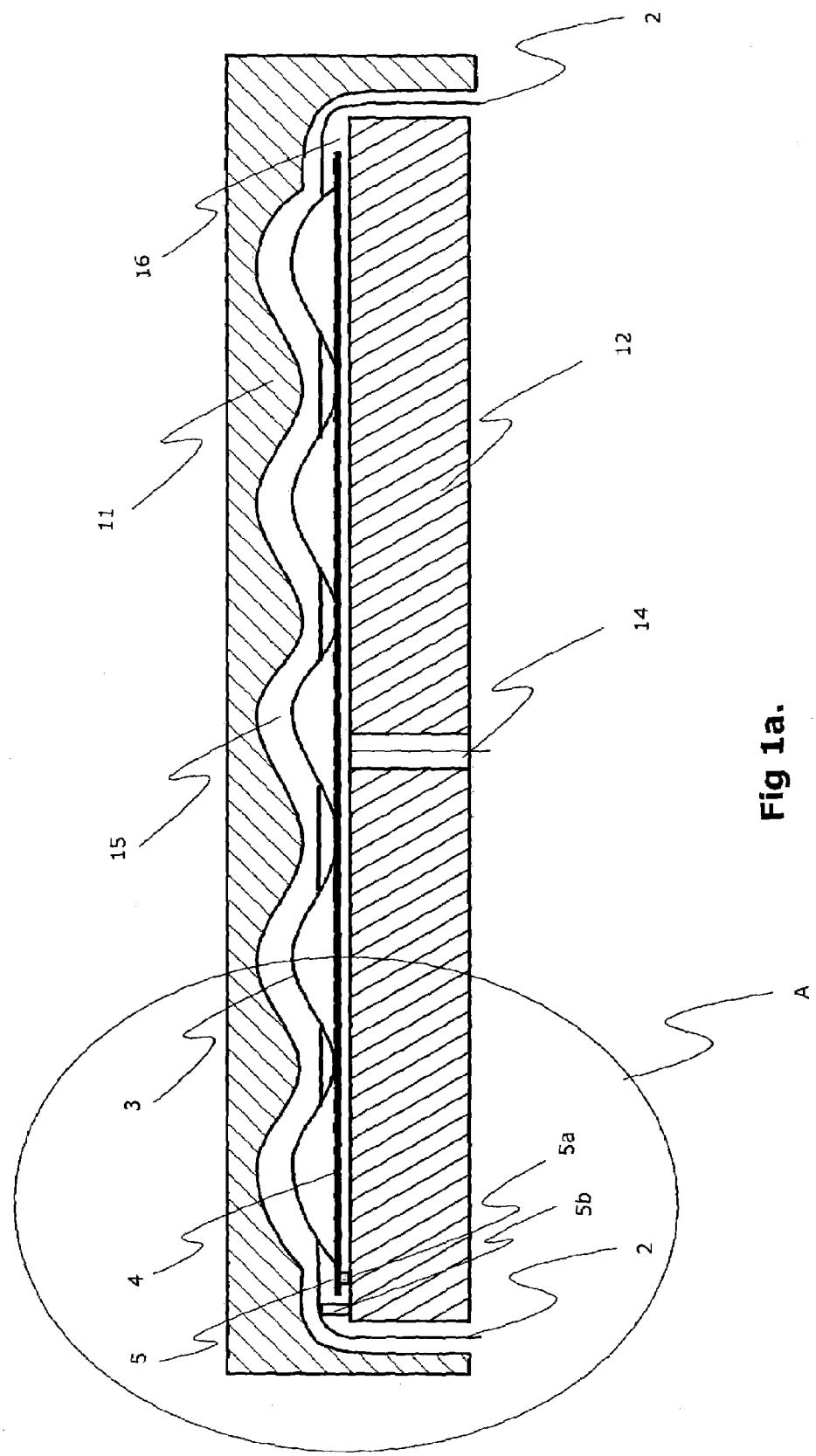
FIG. 1a shows a cross-section diagram of an embodiment of an electromechanical assembly according to of the invention and an arrangement for manufacture a cover part comprising the electromechanical assembly as an insert during injection moulding.
Figure 1B:
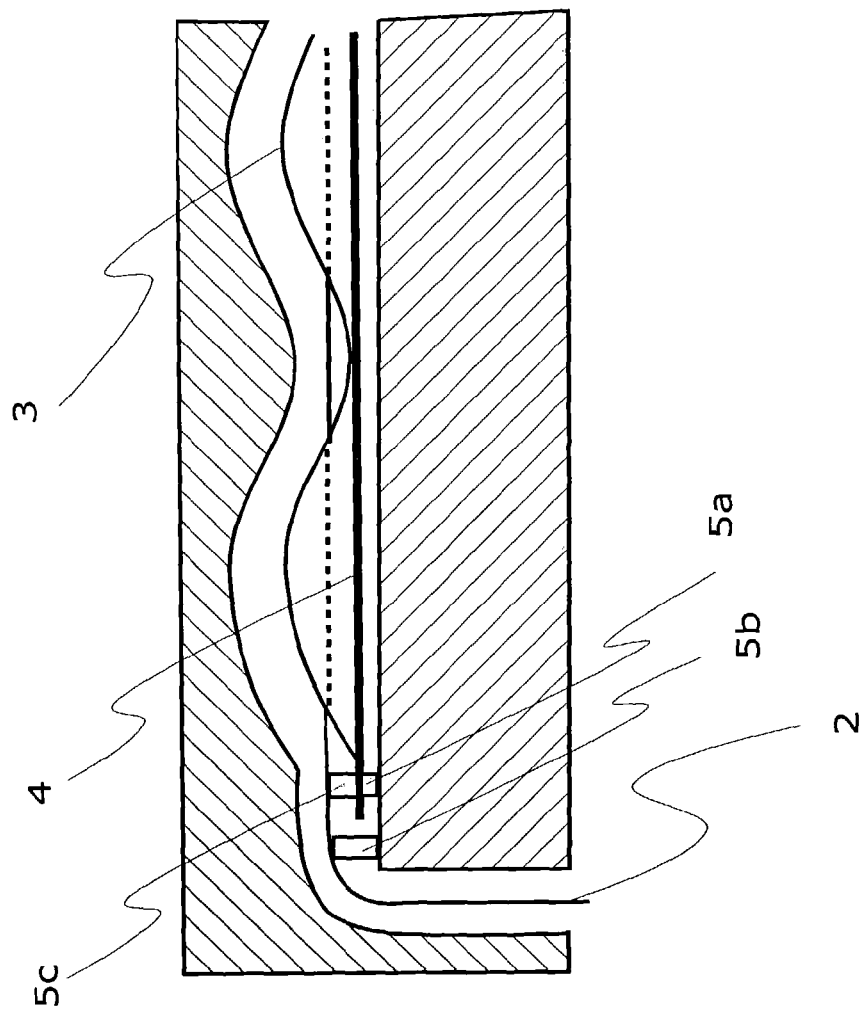
Figure 4A:
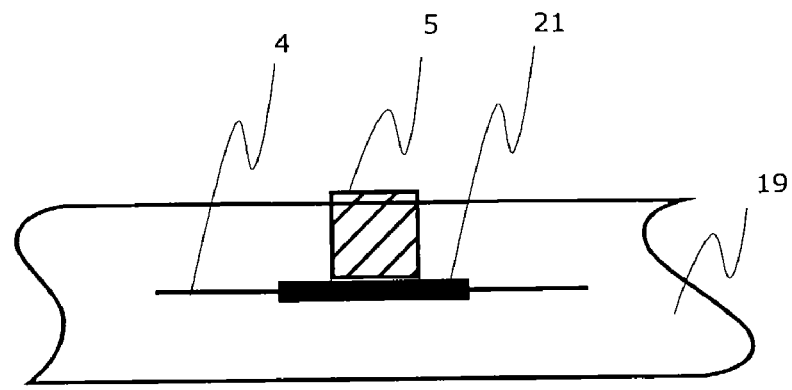
FIG. 4a shows one embodiment of the invention to electrically connect an electromechanical assembly and a cover part to the main electronic device.
Figure 4B:
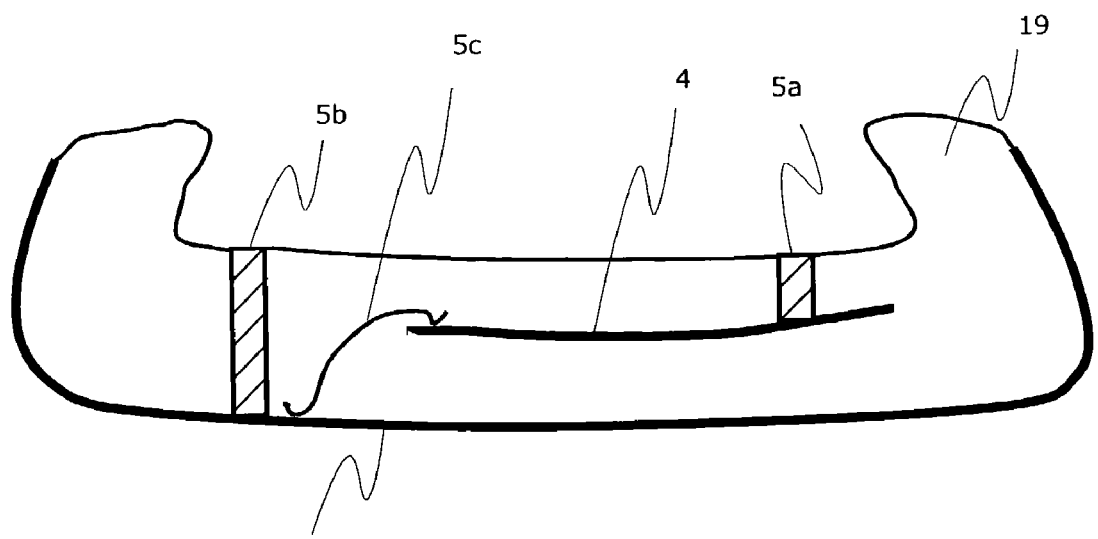
FIG. 4b shows other embodiments of the invention to electrically connect an electromechanical assembly and a cover part to the main electronic device.

FIG. 1a shows an electromechanical assembly comprising a printed wired foil 2, 3, 4 and means for electrically connecting 5 the electromechanical assembly to the electronic device (see FIGS. 1b, 4a and 4b). The printed wired foil 2, 3, 4 is physically separated from the engine printed wired board of the electronic device which engine printed wired board (not shown) is typically locating in association of the electronic unit of the electronic device. The printed wired foil comprises wiring to provide electrical connections to contact points, as well as between the contact points, for components of the electromechanical assembly, and to contact points 5 electrically connecting the electromechanical assembly to the electronic device, isolation layers and decorations, and electronic and mechanical components mounted on the appropriate contact points onto the printed wired foil. Preferably, the printed wired foil comprises wiring to provide contact points 5 electrically connecting the electromechanical assembly to the engine printed wired board.

According to a first embodiment of the invention an electromechanical assembly is an input device assembly 3, 4 comprising an input device 3 connected to a printed wired foil 4 and means for electrically connecting 5 the input device assembly to the electronic device. According to a second embodiment of the invention the electromechanical assembly is a keypad assembly 3, 4 comprising a keypad arrangement 3 connected to a printed wired foil 4 and means for electrically connecting 5 the keypad assembly to the electronic device (see more detailed description in association to FIGS. 3a and 3b). According to a third embodiment of the invention the electromechanical assembly is a touch sensor assembly 3, 4 comprising a touch sensor arrangement. 3 connected to a printed wired foil 4 and means for electrically connecting 5 the touch sensor assembly to the electronic device. Preferably, the printed wired foil comprises wiring to provide contact points electrically connecting the electromechanical assembly to a tactile feed back component of the electronic device. According to a fourth embodiment of the invention the electromechanical assembly is any user interface assembly 3, 4 comprising a user interface device 3 connected to a printed wired foil 4 and means for electrically connecting 5 the user interface assembly to the electronic device. According to a fifth embodiment of the invention the electromechanical assembly is a functional device assembly 3, 4 comprising a functional device 3 connected to a printed wired foil 4 and means for electrically connecting 5 the functional device assembly to the electronic device.

Some applications of the electromechanical assembly according to the embodiments of the invention listed above are, for example, different modules with control electronics: all types of keypads and keyboards, touch-controlled sensors such as a handwriting recognition detector, a picture editing detector and a fat percentage detector, different types of user interface modules, and different types of functionality modules such as a location detector, a flashlight circuit and a camera circuit.

Some examples of electronic devices into which the functionality of above mentioned electromechanical assemblies can be integrated are the following portable electronic devices: a mobile phone, a communicator, a portable digital assistant (PDA), a palmtop computer, a laptop computer, a web terminal equipment, a digital camera, a game computer and an entertainment device, and as well portable measuring and testing devices. The requirements for portable electronic devices are compactness, small size, lightness, robustness and reliability. Among users of portable electronics there is a gaining aspiration to personalize the user interface and outlook of the device, which means that customizability and upgradability are also requirements of the modern portable device. More and more, there is a need for several user interfaces for different purposes to be used in a single portable electronic device as a platform. A solution for this is the use of exchangeable user interfaces in the same way as exchangeable cover parts, which are decorated in various ways, are used today in portable electronics, such as mobile phones.

The electronic device comprising a cover part and means for mechanically connecting the cover part to the electronic device is arranged. According to the invention the electromechanical assembly 3, 4 and the cover part is arranged to compose an integrated combination which is detachable from the electronic device. According to a preferred embodiment of the invention the electromechanical assembly 3, 4 is integrated into the cover part to compose an integrated combination which is detachable from the electronic device. According to a first embodiment an input device assembly 3, 4 is integrated into the cover part to compose an integrated combination which is detachable from the electronic device. According to a second embodiment the keypad assembly 3, 4 is integrated into the cover part to compose an integrated combination which is detachable from the electronic device. According to a third embodiment the touch sensor assembly 3, 4 is integrated into the cover part to compose an integrated combination which is detachable from the electronic device. Preferably, according to an embodiment of the invention the cover part is exchangeable.

FIG. 1*b* shows an embodiment of an electromechanical assembly according to the invention to electrically connecting 5 the electromechanical assembly to the main electronic device, energy source or other electronic functionality unit. To do this connecting means 5*a*, 5*b*, 5*c* are arranged from a printed wired foil 4 and/or from a printed foil 2 to the engine printed wired board of the electronic device and/or when necessary between the printed wired foil and the printed foil. These connecting means are attached on their other end to the printed wired foil or the printed foil to form the electrical connection. While FIG. 1*b* depicts a detail of FIG. 1*a* (area A) it doesn't mean that the connecting means would always be locating within this area A, but said connecting means may be located freely anywhere along the printed (wired) foils in association with the electromechanical assembly. The connecting means 5*a*, 5*b*, 5*c* are discussed more detail in connection with FIGS. 4*a* and 4*b*.

Figure 2:
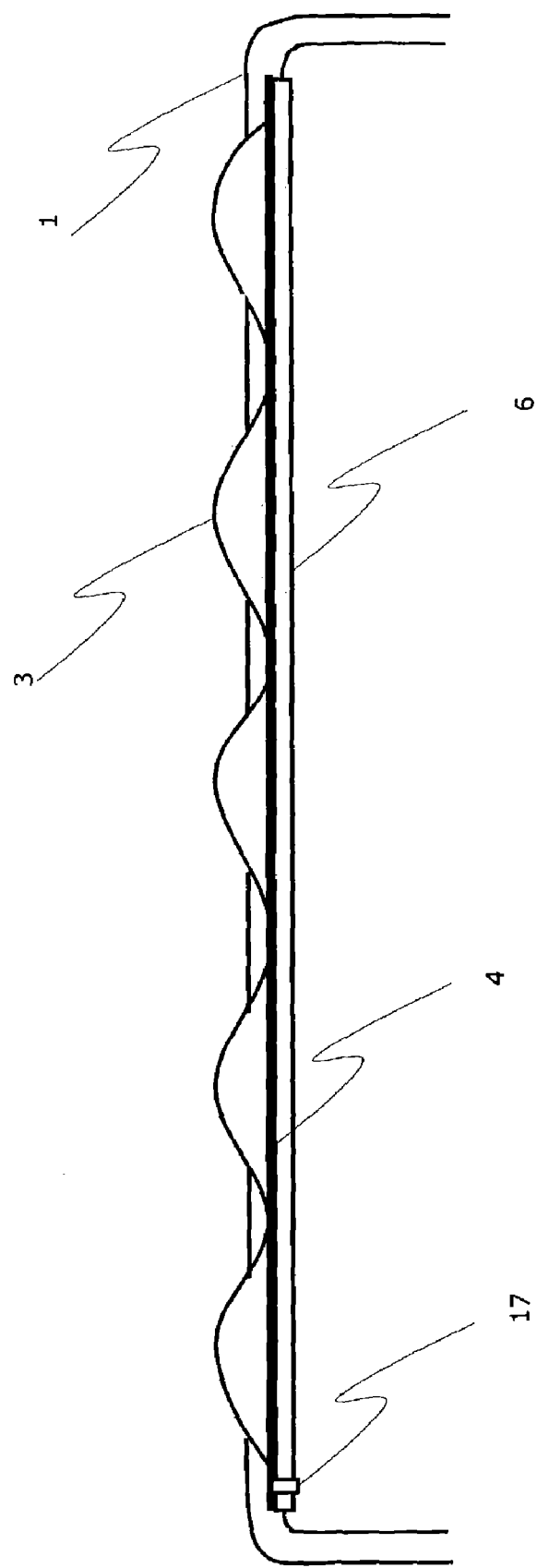
FIG. 2 shows a cross-section diagram of another embodiment of an electromechanical assembly according to the invention.

The cover part is manufactured by the injection moulding technology which is also called the in mould technology or in mould decoration (IMD) technology. During the IMD process the electromechanical assembly is arranged to be an insert which is integrated into the cover part to compose an integrated combination which is detachable from the electronic device. To do this, as shown in FIG. 1*a*, a first mould 12 under the electromechanical assembly and a second mould 11 on top of the electromechanical assembly is needed. Between the moulds is fixed a cavity 15, 16 where the electromechanical assembly is arranged so that connecting means 5*a*, 5*b* are arranged to be located at the electrical contact points 5 between the printed wired foil 3 and the first mould 12 and/or between the printed foil 2 and the first mould 12 during the injection moulding. According an embodiment of the invention a printed foil 2 is arranged on top of the electromechanical assembly and the second mould 11 is set on top of the printed foil 2 so that the lower end of the first mould 12 and the printed foil 2 are engaged to each other, i.e. the cavity 15 above the electromechanical assembly disappears. The lower end of the second mould 11 is formed to follow a shape of an outer part of the electromechanical assembly. A supporting foil 6 is arranged to support the electromechanical assembly from bottom side 4, the support layer also comprising a light source (not shown) to be directed upwards (see FIG. 2). When the resin, e.g. engineering plastic, is injected through the hole 14 of the first mould 12 to the back of the electromechanical assembly to fill with plastics the cavity area 16. During the injection moulding process joints 18 between the printed foil 2 and the printed wired foil 3 will be melted together to form a sealed joint (see FIG. 3*a*). According to another embodiment of the invention the printed foil is a customized injection moulding (CIM) foil 2. According to still another embodiment of the invention a front cover 1, so called A-cover, of the portable electronic device, as shown in FIG. 2, is arranged on top of the electromechanical assembly 3, 4 and the second mould 11 is set on top of the front cover so that the lower end of the second mould and the front cover are engaged to each other, i.e. the cavity 15 above the electromechanical assembly disappears. A supporting foil 6 is arranged to support the electromechanical assembly from bottom side 4, the support layer also comprising a light source to be directed upwards, and an additional supporting foil 9 may be installed under a supporting foil 6 if wanted (see FIG. 3*b*). A hole 17 through the supporting foils 6, 9 is arranged for electrical contacts to the electronic device so that the connecting means 5*a*, 5*b* are piped through the hole 17. The resin, e.g. engineering plastic, is injected through the hole 14 of the first mould 12 to the back of the electromechanical assembly to fill with plastics the cavity area 16.

Figure 1C:
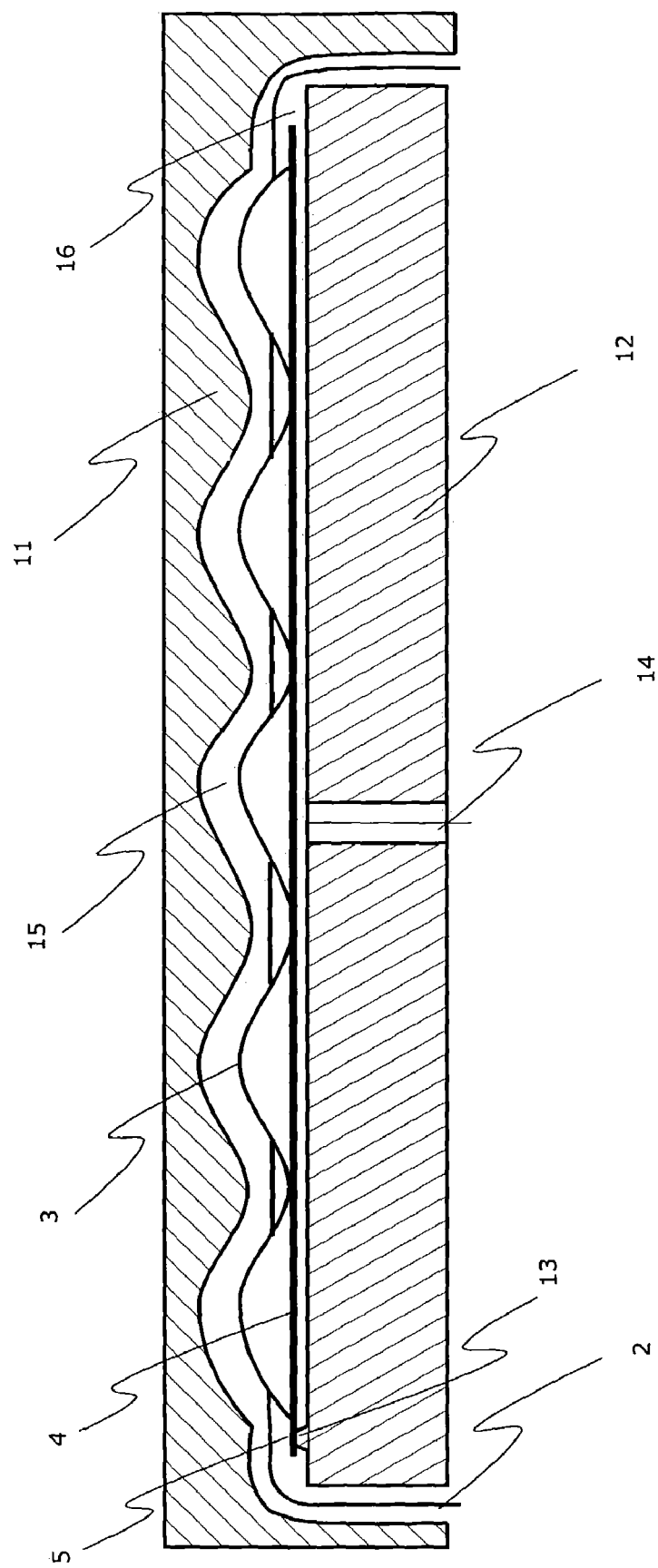
FIG. 1c shows a cross-section diagram of one embodiment of an electromechanical assembly according to the invention.

As shown in FIG. 1*c*, according still another embodiment between the moulds 11, 12 is fixed a cavity 15, 16 where the electromechanical assembly is arranged so that a bump 13 is arranged to protect the electrical contact points 5 not to be filled with plastic and leave the contact points unexposed during the injection moulding. According to this embodiment connecting means 5*a*, 5*b* are installed after the injection moulding process. In this embodiment the connecting means are any type of small, medium-size or even rather large-size connectors, such as pogo pin connectors and spring connectors are used, and they are assembled afterwards.

As mentioned above according to an embodiment of the invention the printed foil 2 is a customized injection moulding (CIM) foil. It is known that the CIM foil is used to forge the decoration with desired texts, patterns, images, pictures or alike layouts to in-mould decoration (IMD) objects. According to the invention in addition to said decoration also the wiring can be implemented to the foil during the printing process before starting the IMD process. This means that the CIM foil as a printed foil 2 is like a printed wired foil 3 in relation to electrical connectivity.

According one embodiment of the invention a CIM foil 2 is arranged on top of the keypad assembly 3, 4 and the second mould 11 is set on top of the CIM foil so that the lower end of the second mould and the CIM foil are engaged to each other, i.e. the cavity 15 above the keypad assembly disappears. The lower end of the second mould 11 is formed to follow a shape of domes 3 of the keypad assembly. A supporting foil 6 is arranged to support the keypad assembly from bottom side 4, the support layer also comprising a light source to be directed upwards (see FIG. 2). When the resin, e.g. engineering plastic, is injected through the hole 14 of the first mould 12 to the back of the keypad assembly to fill with plastics the cavity area 16. During the injection moulding process joints 18 between the CIM foil 2 and the printed wired foil 3 will be melted together to form a sealed joint (see FIG. 3a).

As shown in FIG. 2, according to another embodiment of the invention a front cover 1, so called A-cover, of the portable electronic device, , is arranged on top of the keypad assembly 3, 4 and the second mould 11 is set on top of the cover so that the lower end of the second mould and the cover are engaged to each other, i.e. the cavity 15 above the keypad assembly disappears. The first and second mould are arranged in FIG. 2 (not depicted) in the same way as in FIGS. 1a and 1c. A supporting foil 6 is arranged to support the keypad assembly from bottom side 4, the support layer also comprising a light source to be directed upwards, and an additional supporting foil 9 may be installed under a supporting foil 6 if wanted (see FIG. 3b). A hole 17 through the foils 6, 9 is arranged for electrical contacts to the electronic device. When the resin, e.g. engineering plastic, is injected through the hole 14 of the first mould 12 to the back of the keypad assembly to fill with plastics the cavity area 16.

FIGS. 3a and 3b show a keypad structure of the keypad assembly according to the invention. FIG. 3a shows a detail structure of one keydome of the keypad of the keyboard which keyboard is put as an insert into the mould 11, 12 before the injection molding. The keypad comprises a printed foil 3 and a printed wired foil 4 wherein decorations and other graphics details are arranged to a lower surface of the printed foil 3, an upper surface of the printed foil 3 is arranged to be finger touchable and electrical connections are arranged to an upper surface of the printed wired foil 4. The printed foil is arranged to be above the printed wired foil. A dome sheet layer 7 is placed between the printed foil and the printed wired foil, wherein the dome sheet 7 is electrically conductive at least at the concave surface 8 of each dome. The printed wired foil 4 comprises wiring for electrically connecting contact points of the concave surface 8 of each dome to each other and to the contact points for connections to the electronic device. According to one embodiment the contact points to the electronic device are connected via the hole 17a through the supporting foil 6 and possible additional supporting foil 9 as shown in FIG. 3b.

According to an embodiment of the invention the keypad comprises two printed wired foils 3, 4, preferably a multi-layer printed wired foil 3, 4 wherein electrical connections are arranged to a lower surface of a first printed wired foil 3 and an upper surface of a second printed wired foil 4. An upper surface of the first printed wired foil 3 is arranged to be finger touchable. The first printed wired foil is arranged to be above the second printed wired foil. A dome sheet layer 7 is placed between the first and second printed wired foil, wherein the dome sheet 7 is electrically conductive at least at the concave surface 8 of each dome. The second printed wired foil 4 comprises wiring for electrically connecting contact points of the concave surface 8 of each dome to each other and to the contact points for connections to the electronic device. According to one embodiment the contact points to the electronic device are connected via the hole 17a through the supporting foil 6 and possible additional supporting foil 9 as shown in FIG. 3b.

In FIG. 3a the joints 18 between the cover foil 2, which is perforated with holes in the place of keydomes, and the printed foil 3, or alternatively the printed wired foil 3, will be melted together to form a sealed joint during the injection moulding. According to one embodiment the joints 18 between the CIM foil 2, which is perforated with holes in the place of keydomes, and the printed wired foil 3 will be melted together to form a sealed joint during the injection moulding. According another embodiment of the invention a front cover 1, of the portable electronic device, as shown in FIG. 3b, is placed on top of the keypad assembly 3, 4 so that a tight bond is formed between the holes of the front cover and the printed wired foil at the place of the keydomes. A supporting foil 6 is arranged to support the keypad assembly from bottom side 4, the support layer also comprising a light source to be directed upwards, and an additional supporting foil 9 may be installed under a supporting foil 6 if needed. The light source in association with the supporting foil 6 is arranged by e.g. a rigid light guide or an electroluminescence foil, and the light is arranged to come out only in the place of keys upwards.

FIGS. 4a and 4b show examples of electrically connecting an electromechanical assembly according to the invention to the electronic device, power source or other electronic functionality unit. In FIG. 4a there is arranged connecting means 5 which is attached on its first end to the contact points 21 on the printed wired foil 4. The connecting means is preferably a connector 5 which is soldered, glued or other way fixed to a contact pad 21 on a flexible printed wired board or printed wired foil 4 before the injection mould process. Any small and universal connectors may be used, preferably a connector in a shape of a metallic cylinder, e.g. R-pin connectors. During the injection mould process the connector being part of the electromechanical assembly will be covered totally with plastics. When the injection mould process is completed a second end of the connector 5, which forms so called R-pins, is either a little bit protruding out of the mould 19 or a little bit inside the mould 19. After this the second end of the connector with R-pins is exposed by mechanical grinding of the plastic surface. In FIG. 4a the mould 19 is representing a piece of the cover part of the electronic device and a reference number 19a relates to that edge of the cover part where the connectors have outlets from the cover part. The second end of the connector 5 is forming a contact pin to be electrically connected to the engine PWB of the electronic device. In other words, these type of connectors are used to connect the inmold electronics of the electromechanical assembly being inside the cover part to the surface of the mechanical part of the cover part and further to the engine PWB and/or energy source.

FIG. 4b shows connecting means 5a, 5b, 5c for electrically connecting the printed wired foil 4 to the engine PWB or energy source (5a), the printed foil, preferably the CIM foil 2, to the engine PWB (5b) and the printed foil, preferably CIM foil 2, to the printed wired foil 4 (5c). Preferably the CIM foil as a printed foil, having printed wiring and decoration, is like the printed wired foil in relation to electrical connectivity properties. The connecting means is preferably a connector 5a, 5b, 5c which is soldered, glued or other way fixed to a contact pad on a flexible printed wired board or printed wired foil 4 before the injection mould process. Any small and universal connectors may be used, preferably in a shape of metallic cylinder, e.g. R-pin connectors. When the injection mould process is completed a second end of the connector 5a, 5b, which forms so called R-pins, is either a little bit protruding out of the mould 19 or a little bit inside the mould 19 and then the second end of the connector with R-pins is exposed by mechanical grinding of the plastic surface. The connecting means 5c is fixed firmly between the foils 2, 4 and it is any small type of appropriate connector such as R pin connector, spring connector or jumper connection.

Figure 5:
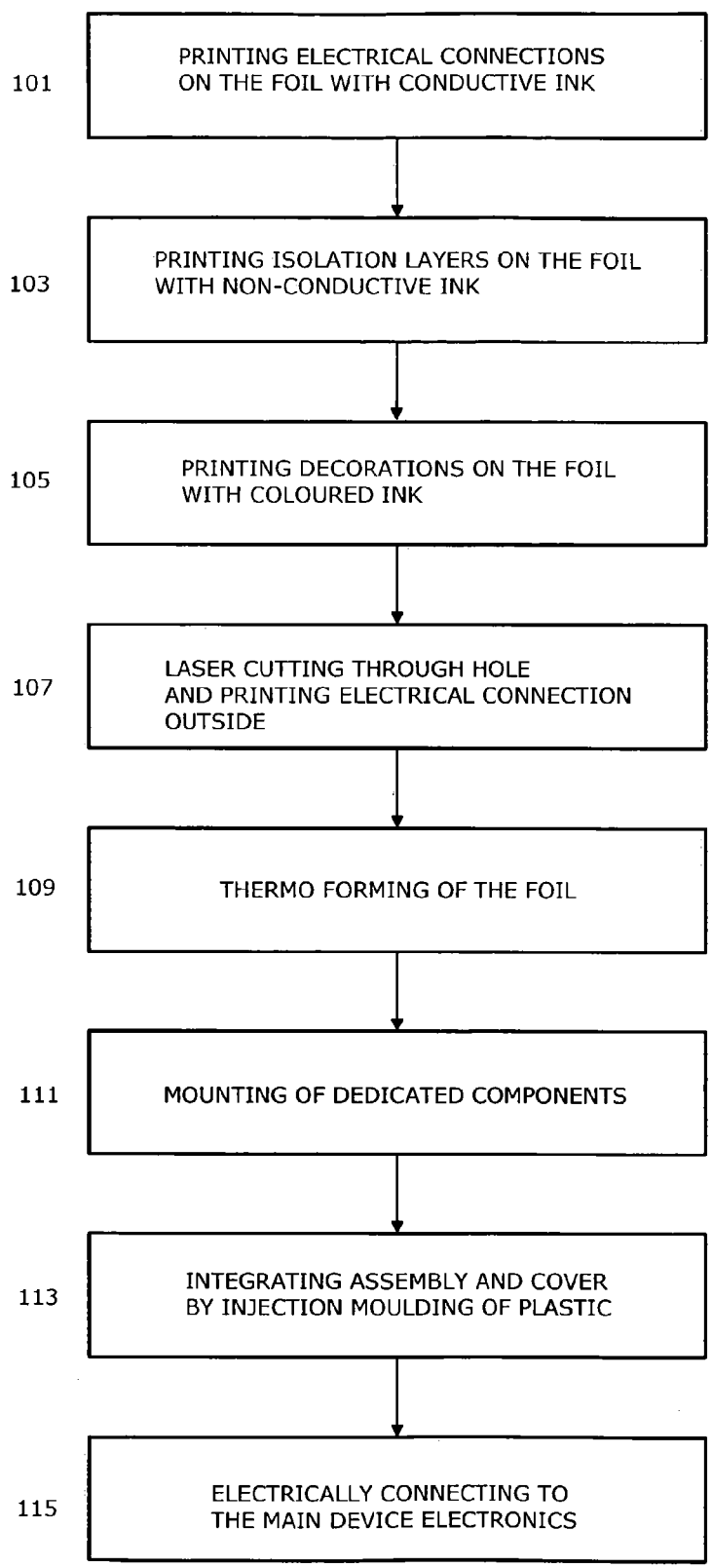
FIG. 5 shows a block diagram of an embodiment of a method for manufacturing an electromechanical assembly and a cover part combined together according to the invention.

FIG. 5 shows a method for manufacturing an electromechanical assembly and a cover part for an electronic device, the electromechanical assembly comprising at least a printed wired foil, and the electronic device comprising at least one cover part. According to the invention the electromechanical assembly and the cover part are manufactured using the same manufacturing technology and process which facilitates and makes cost effective the manufacturing of the electronic device. The method comprising steps where in steps 101–111 the printed wired foil is electrically connected to the electromechanical assembly and to the electronic device and in step 113 the electromechanical assembly and the cover part is composed to be an integrated combination which is detachable from the electronic device. Finally, the cover part will be detachably mechanically connected to the electronic device. According to a preferred embodiment the method comprises a step 113 of integrating the electromechanical assembly into the cover part to compose an integrated combination which is detachable from the electronic device.

According to an embodiment of the invention the step 101–111 of electrically connecting comprises further steps, where in step 101 the wiring onto the printed wired foil, preferably a multi-layer printed wired foil, is provided by printing with conductive ink electrical connections to contact points and between the contact points for components of the electromechanical assembly, and to contact points electrically connecting the electromechanical assembly to the electronic device, preferably to an engine printed wired board. As an example of the conductive ink is a silver polymer paste. In next step 103 the isolation layers are printed with non-conductive ink onto the printed wired foil, and in step 105 decorations are printed with coloured ink onto the printed wired foil, or alternatively onto the printed foil. According to one embodiment of the invention the step 101 of electrically connecting comprises further step of printing with conductive ink the wiring onto the printed wired foil to provide electrical connections to at least one contact point electrically connecting the electromechanical assembly to a tactile feed back component of the electronic device. According to another embodiment in step 107 the electromechanical assembly is electrically connected via the contact point from the electromechanical assembly to the electronic device, preferably to the engine printed wired board, and/or to the power source. The connecting means are attached on their other end to the printed wired foil and/or printed foil, preferably the CIM foil, to form the electrical connection to the electronic device, power source or other electronic functionality unit. As an example, the other end of small universal connectors, preferably metallic cylindrical R pin connectors, are soldered or glued to the contact point on the printed wired foil and/or CIM foil.

According to still another embodiment the step of electrically connecting comprises further a step 107 of cutting a hole through the printed wired foil at the contact point to provide electrical connection to other electronic functionality unit, e.g. the tactile feedback component, to be located on the opposite side of the cover part than other connecting means. As an example of step 107 is a through hole wiring by laser to provide electrical contacts to the outside surface for user interface sensors, such as a fat percentage detector.

According to one embodiment of the invention the step 101–111 of electrically connecting comprises step 101 of printing a lower surface of a first printed wired foil and processing an upper surface of the first printed wired foil to be finger touchable, and printing an upper surface of a second printed wired foil, the first printed wired foil being above the second printed wired foil, and placing a dome sheet layer between the first and second printed wired foil, wherein the dome sheet is electrically conductive at the concave surface of each dome. According to another embodiment of the invention the step 101–111 of electrically connecting comprises step 101 of printing an upper surface of a printed wired foil, and step 105 of printing a lower surface of a printed foil and processing an upper surface of the printed foil to be finger touchable, the printed foil being above the printed wired foil, and placing a dome sheet layer between the printed foil and the printed wired foil, wherein the dome sheet is electrically conductive at the concave surface of each dome.

Next in step 109 a formed printed wired foil is generated by the thermoforming of the printed wired foil to a desired shape. According to an embodiment of the invention in step 109 a formed printed wired foil is generated by the thermoforming of the combination of the printed foil and the printed wired foil to a desired shape. Then step 111 follows to mount electrical and mechanical components to the formed printed wired foil. According to one embodiment the step 111 of mounting mechanical components comprises mounting a keymat to the formed printed wired foil and printing with conductive ink the wiring onto the keymat to provide electrical connections to contact points and between the contact points for keypad of the electromechanical assembly. According to another embodiment the step 111 of mounting comprises placing a support layer under the second printed wired foil, which support layer comprises a light source, e.g. a rigid light guide or an electroluminescence foil emitting the light upward in the place of each dome. According to still another embodiment the step 111 of mounting comprises placing a support layer under the combination of the printed foil and the printed wired foil. As an example of step 111 is mounting of separated components like leds, resistors to the formed printed wired foil using anisotropically conductive glue or conductive tapes.

According to the invention the result of step 111 is an electromechanical assembly, which will be as an insert to be put into mould before the injection mould process.

In step 113 the electromechanical assembly and the cover part is composed to be an integrated combination, preferably the electromechanical assembly is integrated into the cover part to compose an integrated combination, which will be detachable from the electronic device. According to one embodiment the electromechanical assembly is a formed printed wired foil which an insert during the injection moulding process. According to another embodiment the electromechanical assembly is an insert during the injection moulding process. As an example of step 113 the formed printed wired foil, or alternatively the formed combination of the printed foil and the printed wired foil, is placed as an insert to the mould and the molten resin, e.g. molten plastics, is injected e.g. by a nozzle head to the mould to form tactile taps and a terminal cover.

According to an embodiment of the invention in step 113 the formed printed wired foil is inserted on top of a mould comprising a through hole, preferably a vertical hole, and the connecting means of the formed printed wired foil are directed to a position towards the mould (see FIG. 1*a*). Then a printed foil, referred here as a cover foil, is placed on top of the formed printed wired foil. Another mould is then placed on top of the cover foil so that a cavity is provided between the lower mould and the formed printed wired foil, and a lower edge of the upper mould is engaged to follow a shape of the formed printed wired foil. Then the moulds are arranged to hold still, and finally, molten resin e.g. plastic is injected via the through hole to the cavity between the upper and lower moulds.

According to another embodiment of the invention in step 113 the formed printed wired foil is inserted on top of a mould comprising a through hole, preferably a vertical hole, and a bump on top and the formed printed wired foil is placed to a position where the bump masks the contact points from the electromechanical assembly to the electronic device (see FIG. 1*c*). Then a cover foil is placed on top of the formed printed wired foil. Another mould is then placed on top of the cover foil so that a cavity is provided between the lower mould and the formed printed wired foil, and a lower edge of the upper mould is engaged to follow a shape of the formed printed wired foil. Then the moulds are arranged to hold still, and finally, molten resin e.g. plastic is injected via the through hole to the cavity between the upper and lower moulds.

According to an embodiment of the invention in step 113 a cover foil is placed on top of the formed printed wired foil, preferably a perforated cover foil is placed on top of the formed printed wired foil comprising a dome sheet layer, wherein a perforation of the cover foil is locating at the location of the dome of the dome sheet, so that the perforated cover foil and the formed printed wired foil with domes compose a solid combination. According to another embodiment of the invention a cover foil is a CIM foil, preferably a perforated CIM foil. According still another embodiment of the invention in step 113 molten resin e.g. molten plastic is injected to seam joints between edges of the perforations of the cover foil, preferably CIM foil, and the dome sheet during the injection moulding.

Finally, according to step 115 the combination of the cover part and the electromechanical assembly is electrically connected by connecting means to the electronic device, preferably to the engine printed wired board, power source or other electronic functionality unit. Step 115 comprises a preliminary step of cleaning the outlets of the connecting means by grinding the surface of the plastic cover to expose the contact pins of the contactor, preferably R pin contactor, after the injection mould process. This can be done by a mechanical grinder. According to another embodiment in step 115 the combination of the cover part and the electromechanical assembly is electrically connected via the contact point from the electromechanical assembly to the electronic device, preferably to the engine printed wired board, power source or other electronic functionality unit. As an example of step 115 the cover part electronics is connected to the main portable device with a connector having spicular or pin coupling, e.g. pogo pins or spring connectors.

The manufacturing technology according to the invention allows for complete sealing of the components into a plastic resin which is beneficial for wear, shock and moisture protection. Also the manufacturing technology with in moulded covers and overmoulded components provides an excellent prerequisite for making the user interface watertight. It also provides a prerequisite for extreme miniaturisation because the technology takes to active use the volume that has been used for pure mechanics. The manufacturing technology according to the invention also provides a cheap way for producing portable products. The printing of conductors, e.g. screen printing, into the foil is highly cost effective because it is integrated into the graphics printing of the cover part of the portable device. The technology in addition removes a need for many components, such as key buttons from keypads, and provides room for new functionality on the engine PWB.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

The invention claimed is:

1. An electromechanical assembly for an electronic device, the electromechanical assembly comprising at least a printed wired foil and means for electrically connecting the electromechanical assembly to the electronic device, the electronic device comprising at least one cover part and means for mechanically connecting the cover part to the electronic device, wherein the electromechanical assembly is arranged to be an insert during an injection molding process to produce the cover part so that the electromechanical assembly and the cover part are arranged to compose an integrated combination which is detachable from the electronic device.

2. An electromechanical assembly according to claim 1, wherein the electromechanical assembly is integrated into the cover part to compose an integrated combination which is detachable from the electronic device.

3. An electromechanical assembly according to claim 1, wherein the printed wired foil is separated from the engine printed wired board of the electronic device.

4. An electromechanical assembly according to claim 1, wherein the printed wired foil comprises:
   wiring to provide electrical connections to contact points and between the contact points for components of the electromechanical assembly and to contact points electrically connecting by connecting means the electromechanical assembly to the electronic device,
   isolation layers,
   decorations, and
   electronic and mechanical components mounted on the appropriate contact points onto the printed wired foil.

5. An electromechanical assembly according to claim 1, wherein the connecting means, preferably small cylindrical connectors are soldered or glued to the contact points electrically connecting the electromechanical assembly to the electronic device.

6. An electromechanical assembly according to claim 5, wherein the electromechanical assembly is an input device assembly comprising at least an input device connected to a printed wired foil and means for electrically connecting the input device assembly to the electronic device, wherein the input device assembly is integrated into the cover part to compose an integrated combination which is detachable from the electronic device.

7. An electromechanical assembly according to claim 1, wherein the electromechanical assembly is a keypad assembly comprising at least a keypad connected to a printed wired foil and means for electrically connecting the keypad assembly to the electronic device, wherein the keypad assembly is integrated into the cover part to compose an integrated combination which is detachable from the electronic device.

8. An electromechanical assembly according to claim 1, wherein the printed wired foil comprises wiring to provide contact points electrically connecting the electromechanical assembly to a tactile feed back component of the electronic device.

9. An electromechanical assembly according to claim 8, wherein the electromechanical assembly is a touch sensor assembly comprising at least a touch sensor connected to a printed wired foil and means for electrically connecting the touch sensor assembly to the electronic device, wherein the touch sensor assembly is integrated into the cover part to compose an integrated combination which is detachable from the electronic device.

10. An electromechanical assembly according to claim 1, wherein the cover part is exchangeable.

11. An electromechanical assembly according to claim 1, wherein the electronic device is one of the following portable electronic devices: a mobile phone, a communicator, a portable digital assistant, a palmtop computer, a laptop computer, a web terminal equipment, a digital camera, a game device, an entertainment device, a power source, a health care and a measuring device.

12. A cover part for an electronic device, the electronic device comprising an electromechanical assembly which comprises at least a printed wired foil and connecting means for electrically connecting the electromechanical assembly to the electronic device, and the electronic device comprising means for mechanically connecting the cover part, wherein the electromechanical assembly is arranged to be an insert during an injection molding process to produce the cover part so that the electromechanical assembly and the cover part are arranged to compose an integrated combination which is detachable from the electronic device.

13. A cover part according to claim 12, wherein the electromechanical assembly is integrated into the cover part to compose an integrated combination which is detachable from the electronic device.

14. A cover part according to claim 12, wherein the electromechanical assembly is one of the following assemblies: an input device assembly, a keypad assembly and a touch sensor assembly.

15. A cover part according to claim 12, wherein the cover part is manufactured by injection moulding.

16. A cover part according to claim 12, wherein the cover part is exchangeable.

17. A cover part according to claim 12, wherein the electronic device is one of the following portable electronic devices: a mobile phone, a communicator, a portable digital assistant, a palmtop computer, a laptop computer, a web terminal equipment, a digital camera, a game device, an entertainment device, a power source, a health care and a measuring device.

18. A method for manufacturing an electromechanical assembly for an electronic device, the electromechanical assembly comprising at least a printed wired foil, and the electronic device comprising at least one cover part, the electromechanical assembly is arranged to be an insert during an injection molding process to produce the cover part, the method comprising:
    electrically connecting a printed wired foil to an electromechanical assembly and to an electronic device having at least one cover part,
    mechanically connecting the cover part to the electronic device, and
    composing the electromechanical assembly and the cover part to be an integrated combination which is detachable from the electronic device.

19. A method for manufacturing an electromechanical assembly according to claim 18, the method comprising integrating the electromechanical assembly into the cover part to compose an integrated combination which is detachable from the electronic device.

20. A method for manufacturing an electromechanical assembly according to claim 19, wherein the printed wired foil is a multi-layer printed wired foil.

21. A method for manufacturing an electromechanical assembly according to claim 20, wherein the electrically connecting further comprises:
    printing with conductive ink the wiring onto the printed wired foil to provide electrical connections to contact points and between the contact points for components of the electromechanical assembly, and to contact points electrically connecting the electromechanical assembly to the electronic device,
    printing with non-conductive ink the isolation layers onto the printed wired foil, and
    printing with coloured ink decorations onto the printed wired foil.

22. method for manufacturing an electromechanical assembly according to claim 21, wherein the electrically connecting further comprises printing with conductive ink the wiring onto the printed wired foil to provide electrical connections to at least one contact point electrically connecting the electromechanical assembly to a tactile feed back component of the electronic device.

23. A method for manufacturing an electromechanical assembly according to claim 22, wherein the electrically connecting further comprises cutting a hole through the printed wired foil at the contact point to the tactile feedback component to provide electrical connection to the tactile feedback component.

24. A method for manufacturing an electromechanical assembly according to claim 23, wherein the electrically connecting comprises printing a lower surface of a printed foil and processing an upper surface of the printed foil to be finger touchable, and printing an upper surface of a printed wired foil, the printed foil being above the printed wired foil, the method further comprising placing a dome sheet layer between the printed foil and the printed wired foil, wherein the dome sheet is electrically conductive at the concave surface of each dome.

25. A method for manufacturing an electromechanical assembly according to claim 24, wherein the printed foil is a first printed wired foil and the printed wired foil is a second printed wired foil.

26. A method for manufacturing an electromechanical assembly according to claim 25, wherein the method comprises thermoforming of the printed wired foil to a desired shape to generate a formed printed wired foil.

27. A method for manufacturing an electromechanical assembly according to claim 26, wherein the method comprises thermoforming of a combination of the printed foil and the printed wired foil to a desired shape to generate a formed printed wired foil.

28. A method for manufacturing an electromechanical assembly according to claim 27, wherein the method comprises mounting electrical and mechanical components to the formed printed wired foil.

29. A method for manufacturing an electromechanical assembly according to claim 28, wherein the method comprises mounting the connecting means, preferably small cylindrical connectors, by soldering or glueing one end of the connecting means to the wiring of the formed printed wired foil.

30. A method for manufacturing an electromechanical assembly according to claim 29, wherein the mounting mechanical components further comprises mounting a keymat to the formed printed wired foil and printing with conductive ink the wiring onto the keymat to provide electrical connections to contact points and between the contact points for keypad of the electromechanical assembly.

31. A method for manufacturing an electromechanical assembly according to claim 30, wherein the method comprises placing a support layer under the formed printed wired foil, the support layer comprising a rigid light guide emitting the light upward in the place of each dome.

32. A method for manufacturing an electromechanical assembly according to claim 31, wherein the method comprises placing a support layer under the formed printed wired foil, the support layer comprising an electroluminescence foil emitting the light upward in the place of each dome.

33. A method for manufacturing a cover part for an electronic device, the electronic device comprising at least an electromechanical assembly which comprises at least a printed wired foil, the electromechanical assembly is arranged to be an insert during an injection molding process to produce the cover part, wherein the method comprises:
    electrically connecting the printed wire foil to the electronic device,
    mechanically connecting the cover part to the electronic device, and
    composing the electromechanical assembly and the cover part to be an integrated combination which is detachable from the electronic device.

34. A method for manufacturing a cover part according to claim 33, wherein the method comprising integrating the electromechanical assembly into the cover part to compose an integrated combination which is detachable from the electronic device.

35. A method for manufacturing a cover part according to claim 34, wherein the electromechanical assembly comprises a formed printed wired foil and connecting means, preferably small cylindrical connectors, first end of the connecting means electrically connected to the wiring of the formed printed wired foil.

36. A method of manufacturing a cover part according to claim 33, wherein the method further comprises:
    inserting the formed printed wired foil on top of a first mould comprising a through hole to a position where the second end of the connecting means are directed towards the first mould,
    placing a cover foil on top of the formed printed wired foil,
    placing a second mould on top of the cover foil so that a cavity is provided between the second mould and the formed printed wired foil, a lower edge of the second mould following a shape of the formed printed wired foil,
    setting the first mould and the second mould against each other so that the lower edge of the second mould is engaged to the cover foil and the combination of the first and second mould is held still, and
    injecting molten resin via the through hole to the cavity between the first mould and the cover foil.

37. A method for manufacturing a cover part according to claim 36, wherein the method comprises after injecting, cleaning, preferably grinding, the second end of the connecting means for electrically connecting the electromechanical assembly to the electronic device.

38. A method for manufacturing a cover part according to claim 37, wherein placing a cover foil on top of the formed printed wired foil comprises placing a perforated cover foil on top of the formed printed wired foil comprising a dome sheet layer, wherein a perforation of the cover foil is locating at the location of the dome of the dome sheet, so that the perforated cover foil and the formed printed wired foil with domes compose a solid combination.

39. A method for manufacturing a cover part according to claim 37, wherein the injecting melted plastic further comprises seaming joints between edges of the perforations of the cover foil and the dome sheet during the injection moulding.

40. A method for manufacturing a cover part according to claim 36, wherein the inserting comprises inserting the formed printed wired foil on top of a first mould comprising a through hole and a bump on top and placing the formed printed wired foil to a position where the bump masks the contact points from the electromechanical assembly to the electronic device, and after injection moulding mounting the connecting means to the place of the bumps.

41. A method for manufacturing a cover part according to claim 39, wherein the cover foil is a prefabricated cover part of the electronic device.

42. An apparatus comprising:
    a printed wired foil, and
    at least one connector for electrically connecting said apparatus to an electronic device having at least one cover part and a mechanical assembly for connecting the cover part to the electronic device,
    wherein the apparatus is configured to be an insert during an injection molding process to produce the cover part so that the apparatus and the cover part are configurable to compose an integrated combination which is detachable from the electronic device.

43. The apparatus according to claim 42, wherein the apparatus is integrated into the cover part to compose an integrated combination which is detachable from the electronic device.

44. The apparatus according to claim 42, wherein the printed wired foil is separated from the printed wired board of the electronic device.

45. The apparatus according to claim 42, wherein the printed wired foil comprises:

wiring to provide electrical connections to contact points and between the contact points for components of the apparatus and to contact points electrically connecting by the at least one connector the apparatus to the electronic device, isolation layers, decorations, and electronic and mechanical components mounted on the appropriate contact points onto the printed wired foil.

46. The apparatus according to claim 42, wherein the at least one connector comprises small cylindrical connectors that are soldered or glued to the contact points electrically connecting the apparatus to the electronic device.

47. The apparatus according to claim 46, wherein the apparatus is an input device assembly comprising at least an input device connected to a printed wired foil and at least one connector for electrically connecting the input device assembly to the electronic device, wherein the input device assembly is integrated into the cover part to compose an integrated combination which is detachable from the electronic device.

48. The apparatus according to claim 42, wherein the apparatus is a keypad assembly comprising at least a keypad connected to a printed wired foil and at least one connector for electrically connecting the keypad assembly to the electronic device, wherein the keypad assembly is integrated into the cover part to compose an integrated combination which is detachable from the electronic device.

49. The apparatus according to claim 42, wherein the printed wired foil comprises wiring to provide contact points electrically connecting the apparatus to a tactile feed back component of the electronic device.

50. The apparatus according to claim 49, wherein the apparatus is a touch sensor assembly comprising at least a touch sensor connected to a printed wired foil and at least one connector for electrically connecting the touch sensor assembly to the electronic device, wherein the touch sensor assembly is integrated into the cover part to compose an integrated combination which is detachable from the electronic device.

51. The apparatus according to claim 42, wherein the cover part is exchangeable.

52. The apparatus according to claim 42, wherein the electronic device is one of the following portable electronic devices: a mobile phone, a communicator, a portable digital assistant, a palmtop computer, a laptop computer, a web terminal equipment, a digital camera, a game device, an entertainment device, a power source, a health care and a measuring device.

53. A cover part for an electronic device, the electronic device comprising an electromechanical assembly which comprises at least a printed wired foil and at least one connector for electrically connecting the electromechanical assembly to the electronic device, and the electronic device further comprising a mechanical coupler for mechanically connecting the cover part, wherein the electromechanical assembly is arranged to be an insert during an injection molding process to produce the cover part so that the electromechanical assembly and the cover part are arranged to compose an integrated combination which is detachable from the electronic device.

54. The cover part according to claim 53, wherein the electromechanical assembly is integrated into the cover part to compose an integrated combination which is detachable from the electronic device.

55. The cover part according to claim 53, wherein the electromechanical assembly is one of the following assemblies: an input device assembly, a keypad assembly and a touch sensor assembly.

56. The cover part according to claim 53, wherein the cover part is manufactured by injection moulding.

57. The cover part according to claim 53, wherein the cover part is exchangeable.

58. The cover part according to claim 53, wherein the electronic device is one of the following portable electronic devices: a mobile phone, a communicator, a portable digital assistant, a palmtop computer, a laptop computer, a web terminal equipment, a digital camera, a game device, an entertainment device, a power source, a health care and a measuring device.

59. An apparatus comprising:

a printed wired foil, and means for electrically connecting said apparatus to an electronic device having at least one cover part and a mechanical assembly for connecting the cover part to the electronic device, wherein the apparatus is configured to be an insert during an injection molding process to produce the cover part so that the apparatus and the cover part are configurable to compose an integrated combination which is detachable from the electronic device.

60. The apparatus according to claim 59, wherein the apparatus is integrated into the cover part to compose an integrated combination which is detachable from the electronic device.

* * * * *

UNITED STATES PATENT AND TRADEMARK OFFICE
CERTIFICATE OF CORRECTION

| | | |
|---|---|---|
| PATENT NO. | : 7,200,009 B2 | Page 1 of 1 |
| APPLICATION NO. | : 10/612397 | |
| DATED | : April 3, 2007 | |
| INVENTOR(S) | : Katri Narhi et al. | |

It is certified that error appears in the above-identified patent and that said Letters Patent is hereby corrected as shown below:

Column 16, line 41, claim 22, line 1, please insert --A-- prior to the word "method".

Column 17, line 47, claim 33, line 7, please replace the word "wire" with --wired--.

Column 17, line 66, claim 36, line 1, please replace the word "of" with --for--.

Signed and Sealed this

Nineteenth Day of June, 2007

JON W. DUDAS
*Director of the United States Patent and Trademark Office*